(12) United States Patent
Wu et al.

(10) Patent No.: US 7,965,884 B2
(45) Date of Patent: Jun. 21, 2011

(54) SYSTEM AND METHOD FOR TESTING LEDS ON A MOTHERBOARD

(75) Inventors: Kuan-Lin Wu, Taipei Hsien (TW);
Wei-Yuan Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 1000 days.

(21) Appl. No.: 11/781,966

(22) Filed: Jul. 24, 2007

(65) Prior Publication Data

US 2008/0112607 A1 May 15, 2008

(30) Foreign Application Priority Data

Nov. 10, 2006 (TW) .............................. 95141731 A

(51) Int. Cl.
*G06K 9/00* (2006.01)
(52) U.S. Cl. .................... 382/149; 250/227.2
(58) Field of Classification Search .................. None
See application file for complete search history.

(56) References Cited

U.S. PATENT DOCUMENTS

| | | | | |
|---|---|---|---|---|
| 4,808,815 | A * | 2/1989 | Langley ............... | 250/227.28 |
| 6,075,448 | A | 6/2000 | Verkhovskiy | |
| 6,956,226 | B2 * | 10/2005 | Bennewitz et al. ...... | 250/559.29 |
| 7,064,832 | B2 * | 6/2006 | Rogers .................. | 356/406 |
| 7,312,874 | B2 * | 12/2007 | Berner .................. | 356/402 |
| 7,382,148 | B2 * | 6/2008 | Dang et al. ............ | 324/767 |
| 7,714,604 | B2 * | 5/2010 | Liu et al. .............. | 324/765 |
| 2003/0161163 | A1 * | 8/2003 | Hussey et al. .......... | 362/487 |

FOREIGN PATENT DOCUMENTS

CN 101187684 A * 5/2008

* cited by examiner

*Primary Examiner* — Bhavesh M Mehta
*Assistant Examiner* — Barry Drennan
(74) *Attorney, Agent, or Firm* — Frank R. Niranjan

(57) ABSTRACT

An exemplary method and system for testing light-emitting diodes (LEDs) uses a camera module to take two bulb images of transparent bulbs connected to each of the LEDs. A first bulb image is captured when the LEDs are set in a power-on state, and a second bulb image is captured when the LEDs are set in a power-off state. The method divides each of the two bulb images into small pictures, and calculates an average pixel value of each of the small pictures. After calculating a first difference of each of the small pictures between the average pixel value and a first predetermined value, and a second difference of each of the small pictures between the average pixel value and a second predetermined value, the method ascertains a present state of each of the LEDs by comparing the two differences.

19 Claims, 4 Drawing Sheets

SYSTEM AND METHOD FOR TESTING LEDS ON A MOTHERBOARD

BACKGROUND OF THE INVENTION

1. Field of the Invention

The present invention relates to the field of testing light emitting diodes (LEDs) and, particularly, to a system and method for testing LEDs on a motherboard.

2. Description of Related Art

Light emitting diodes (LEDs) have been applied with commercial products since the 1960s, due to their favorable characteristics. LEDs display high-shake endurance, long-service life, small power consumption and little heat production. As such, the LED can be applied for daily usage in a variety of ways, such as: household appliances, indicative illumination for equipments or as light sources. In recent years, a printed circuit board (PCB), such as a motherboard, has been made in such a way that it contains one or more LEDs. The one or more LEDs is/are used as external signals, internal diagnostics and for purposes of other suitable applications.

In order to verify whether each LED located on the PCB works in a normal state, it is usually necessary to power up the PCB and manually test the characteristics of the LEDs. However, in situations of manual testing, problems may occur in LED production lines. First of all, manual testing may likely destroy the PCB, if the voltage passing through the PCB gets too high. Secondly, the increase in complexity and the decrease in accuracy of LEDs may also lead to problems. For example, if a human operator testing the characteristics of LEDs only tests the LEDs by viewing the luminance of the LEDs, then the test would likely be inaccurate and error-prone because of man-made negligence in the manual testing process. More importantly, if multiple LEDs are being used on the PCB, the manual testing requirements may become problematic and severely inefficient, resulting in a decrease in productivity.

Therefore, what is needed is a system and method for testing LEDs on a motherboard, particularly, one which can conveniently test the characteristics of the LEDs located on the motherboard. A system and method for testing LEDs on a motherboard, one that can take the place of manual testing, can increase the accuracy of the test results and the efficiency of the test productivity.

SUMMARY OF THE INVENTION

A system for testing light-emitting diodes (LEDs) on a motherboard includes: a motherboard, an insulating plate, a panel, a camera module and a computer. The insulating plate is positioned on the motherboard and configured with optical fibers for inducing beams sourced from the LEDs. The panel is connected to the insulating plate with the optical fibers, and receives the beams transmitted from the LEDs. The panel includes a corresponding number of transparent bulbs configured for outputting the beams sourced from the LEDs. The camera module is fixed on the panel and is configured for taking a first bulb image of the transparent bulbs when the LEDs are powered on and taking a second bulb image of the transparent bulbs when the LEDs are powered off. The computer is connected to the motherboard and the camera module. The computer is configured for dividing the first bulb image and the second bulb image created by the camera module into several small pictures, and calculating an average pixel value of each of the small pictures. The computer is further configured for calculating a first difference of each of the small pictures between the corresponding average pixel value and a first predetermined value, and calculating a second difference of each of the small pictures between the corresponding average pixel value and a second predetermined value. The computer is also further configured for obtaining test results by comparing the first difference with the second difference and reporting the test results.

A method for testing light-emitting diodes (LEDs) on a motherboard includes: using a camera module to take a first bulb image of a corresponding number of transparent bulbs which are connected to each of the LEDs when the LEDs are set in a power-on state and taking a second bulb image of the transparent bulbs when the LEDs are set in a power-off state; processing the first bulb image and the second bulb image and dividing the first bulb image and the second bulb image into small pictures; calculating an average pixel value of each of the small pictures, calculating a first difference of each of the small pictures between the average pixel value and a first predetermined value, and calculating a second difference of each of the small pictures between the average pixel value and a second predetermined value; ascertaining a present state of each of the LEDs by comparing the two differences; obtaining test results by comparing the present state of the LEDs with the set state; and reporting the test results.

Other novel features of the indicated invention will become more apparent from the following detailed description of the preferred embodiment when taken in conjunction with the accompanying drawings.

DETAILED DESCRIPTION OF THE INVENTION

Figure 1:
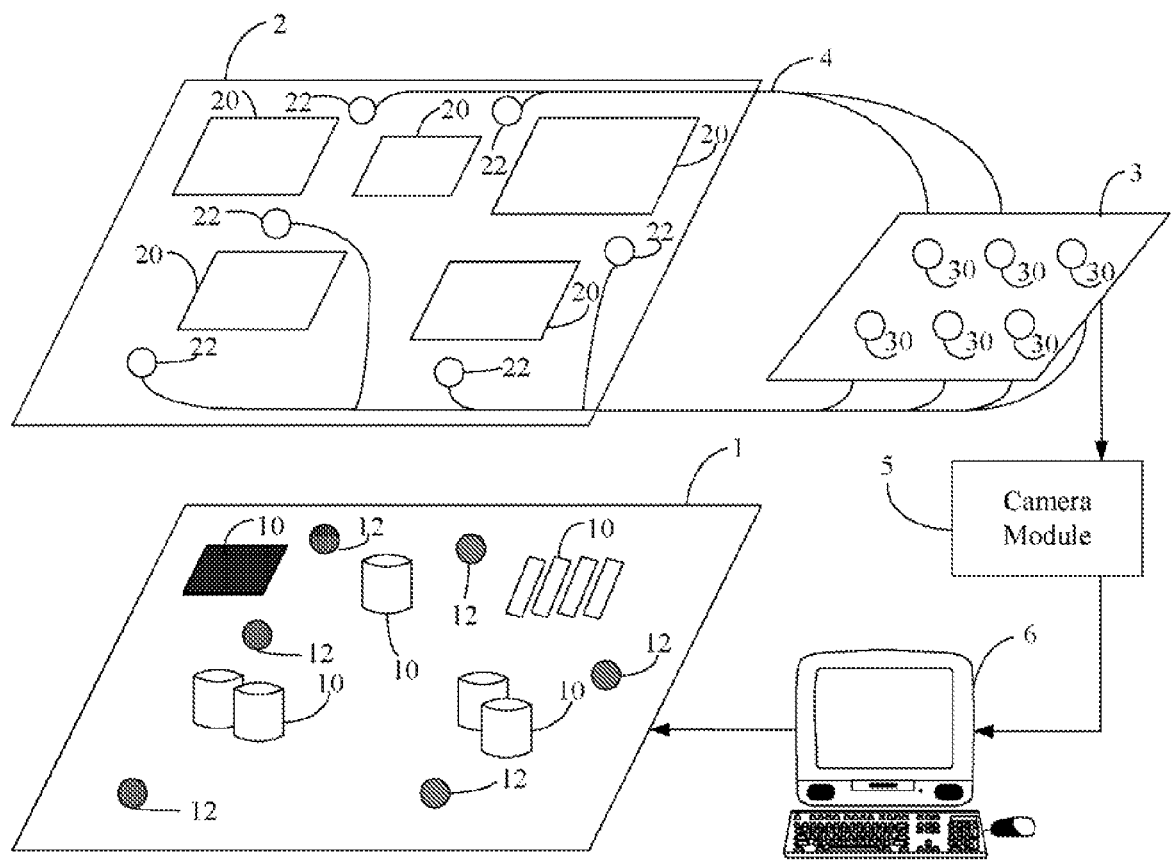
FIG. 1 is a schematic diagram of a system for testing light emitting diodes (LEDs) on a motherboard in accordance with one embodiment.

FIG. 1 is a schematic diagram of a system for testing light emitting diodes (LEDs) on a motherboard (hereinafter, "the system") in accordance with one embodiment. The system typically includes: a motherboard 1, an insulating plate 2, a panel 3, a camera module 5 and a computer 6. The insulating plate 2 is positioned on the motherboard 1 and is overlaying with optical fibers 4. The optical fibers 4 in FIG. 1 are simply indicated and the real size of each of the optical fibers 4 is neglected. Actually, each of the optical fibers 4 is configured with a pipeline. The radius of each pipeline is approximately equal to or a little bit smaller than the radius of the LEDs. The insulating plate 2 is connected with the panel 3 via the optical fibers 4. In the preferred embodiment, the motherboard 1 can be incorporated into the computer 6. In an alternative embodiment, the motherboard 1 is external to the computer 6.

The motherboard 1 mainly includes multiple numbers of components 10 such as a CPU, resistors, capacitors, pins, one or more LEDs 12. In the preferred embodiment, each of the LEDs 12 may be a power LED, a hard-disk-drive LED, or a key-lock LED. The power LED lights up when the computer 6 is powered on. The hard-disk-drive LED lights up when the hard disk drive is being accessed and the light may appear to flicker as the disk exchanges data with other device (i.e., CPU or memory). The key-lock function is provided to lock the computer 6 with a mechanical key, in order to prevent the computer 6 from booting when the computer 6 is locked. There are multi-holes 20 and 22 on the insulating plate 2, corresponding to the positions of the components 10 and the given number of the LEDs 12. The insulating plate 2 covers the motherboard 1 while the multi-holes 20 and 22 thereof provide passways allowing the corresponding components 10 and 12, such as the resistors, the capacitors, the pins, and the LEDs 12, to pass therethrough or received therein. For example, in order to have the insulating plate 2 usefully cover the motherboard 1 the insulating plate 2 has the multi-holes 20 and 22 for the insertion of the components 10 and of the LEDs 12. The size of the insulating plate 2 is designed according to the size of the motherboard 1.

Figure 2:
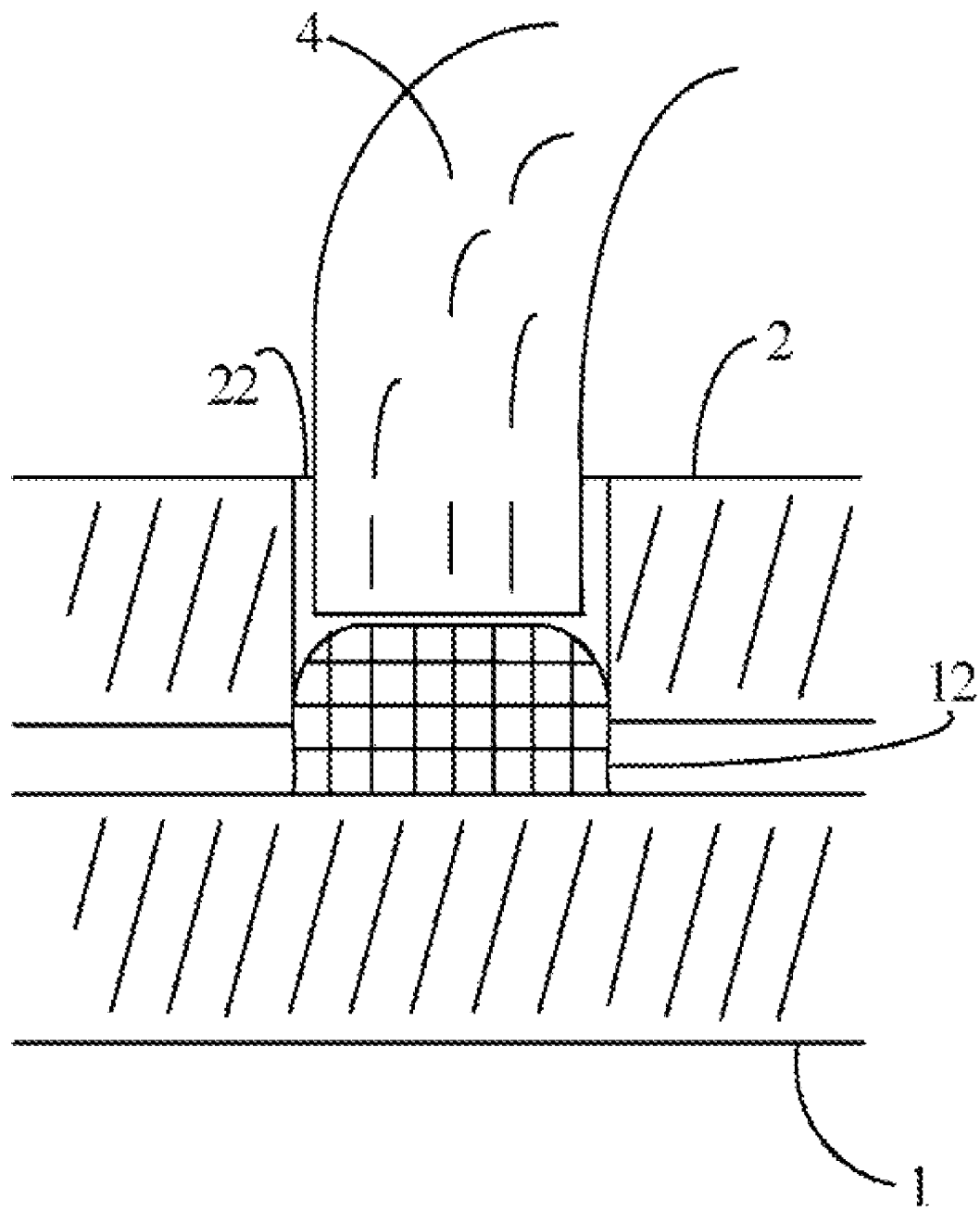
FIG. 2 is a schematic diagram illustrating a proximate (or a connection) of one of the LEDs and the optical fibers via one of multi-holes of FIG. 1.

The optical fibers 4 are posited on a corresponding portion of the insulating plate 2 and is terminated proximate to one of the multi-holes 20 or 22. FIG. 2 is a schematic diagram illustrating a proximate (or a connection) of one of the LEDs 12 and the optical fibers 4 via one of the multi-holes 22. The optical fibers 4 connect the given number of the LEDs 12 with a corresponding number of transparent bulbs 30. Optical fibers 4 are configured for inducing beams sourced from the given number of the LEDs 12 and transmitting the beams to the transparent bulbs 30, which are configured on the panel 3. When the insulating plate 2 is positioned on the motherboard 1, the optical fibers 4 proximate to (or contact) a given number of the LEDs 12 with corresponding ends thereof, thereby forming corresponding number of beams inside the optical fibers 4, up-to a corresponding number of transparent bulbs 30, i.e., the optical fibers 4 guide the beams originated from the LEDs 12 to the transparent bulbs 30. The transparent bulbs 30 are distributed on the panel 3 generally in uniformity and configured for outputting the beams of the given number of the LEDs 12. In the preferred embodiment, the number of the transparent bulbs 30 is greater than or equal to the number of a given number of the LEDs 12. The transparent bulbs 30 can be made of plastic or other materials.

The panel 3 may be a black panel or a white panel and is configured with a cover. In the preferred embodiment, the color of the panel 3 is white, as described in the follows. The camera module 5 is configured on the cover and connects to the computer 6 via a USB (Universal Serial Bus) port or a COM port. A power switch is connected with the panel 3 and is configured for controlling the power on or power off function of the panel 3. In the preferred embodiment, the camera module 5 can be a digital camera or any other camera.

The computer 6 is configured for controlling the given number of the LEDs 12 to power on or power off, by controlling the luminance of the LEDs 12. The computer 6 is further configured for controlling the camera module 5 to take a first bulb image of the number of transparent bulbs 30 on the panel 3 when the LEDs 12 are powered on and take a second bulb image of the transparent bulbs 30 when the LEDs 12 are powered off. The computer 6 can obtain the number of pixels of the first bulb image calculated by the camera module 5. In the preferred embodiment, the number of pixels of the second bulb image is equal to the number of pixels of the first bulb image.

The computer 6 is also further configured for processing the first bulb image and the second bulb image, and dividing the first bulb image and the second bulb image into several small pictures according to locations of the transparent bulbs 30 on the panel 3 and the number of the transparent bulbs 30, and calculating the number of pixels in each of the small pictures based on the number of pixels of the first bulb image. For example, if the pixels of the first bulb image are in a 30 by 20 array and the number of the transparent bulbs 30 on the panel 3 is "25", the computer 6 may calculate the number (X) of pixels of each of the small pictures by using the formula of X=(30*20)/25=24. The computer 6 obtains a pixel value of each of the pixels in each of the small pictures and calculating an average pixel value of each of the small pictures based on the number X of the pixels and the pixel value of each of the pixels in each of the small pictures. For example, if the number of the pixels in one of the small pictures is "24", the pixel values of the small picture are "a1, a2, a3 . . . a24", the computer 6 may calculate the average pixel value $M_t$ of the small picture by using the follow formula of: $M_t$=(a1+a2+a3+ . . . a24)/24.

A pixel (a substantial minimum image element, using the common abbreviation "pix" for "image") is a single point in a graphic image. Each image element is neither a dot, nor a square, but an abstract sample. With care, pixels in an image can be reproduced at any size without the appearance of visible dots or squares. In many contexts, pixels in images are reproduced as dots or square and can be visibly distinct when they are not fine enough. The luminance of each pixel is typically a variable value. In a color-display system, each pixel has typically three primary colors, including: red, green and blue (RGB). The pixel value of each of the pixels is equal to the average of dimensions of RGB, for instance, if the dimension of "R" of one pixel is "30", the dimension of "G" is "20" and the dimension of "B" is "10", the computer 6 obtains the pixel value of the pixel is "20".

The computer 6 calculates a first difference (depicted as "$D_1$") between the average pixel value of each of the small pictures and a first predetermined value $M_1$, and calculates a second difference (depicted as "$D_0$") between the average pixel value of each of the small pictures and a second predetermined value $M_0$. The computer 6 further obtains test results of the given number of the LEDs 12 by comparing the first difference $D_1$ and the second difference $D_0$, the computer 6 ascertains whether each of the LEDs 12 on the motherboard 1 is in an unworkable or workable state according to the test results, and outputs the ascertaining results.

In the preferred embodiment, the computer 6 controls the camera module 5 to take two images of a standard transparent bulb in advance, namely, before the computer 6 controls the camera module 5 to take the two bulb image, an operator puts the standard transparent bulb on the panel 3, if the power switch lights up, the computer 6 controls the camera module 5 to take a first image of the standard transparent bulb; otherwise, if the power switch lights down, the computer 6 also controls the camera module 5 to take a second image of the standard transparent bulb. The standard transparent bulb is a sample of the transparent bulbs 30. Thereby the first predetermined value $M_1$ is an average pixel value of the first image of the standard transparent bulb, and the second predetermined value $M_0$ is an average pixel value of the second image of the standard transparent bulb.

Figure 3:
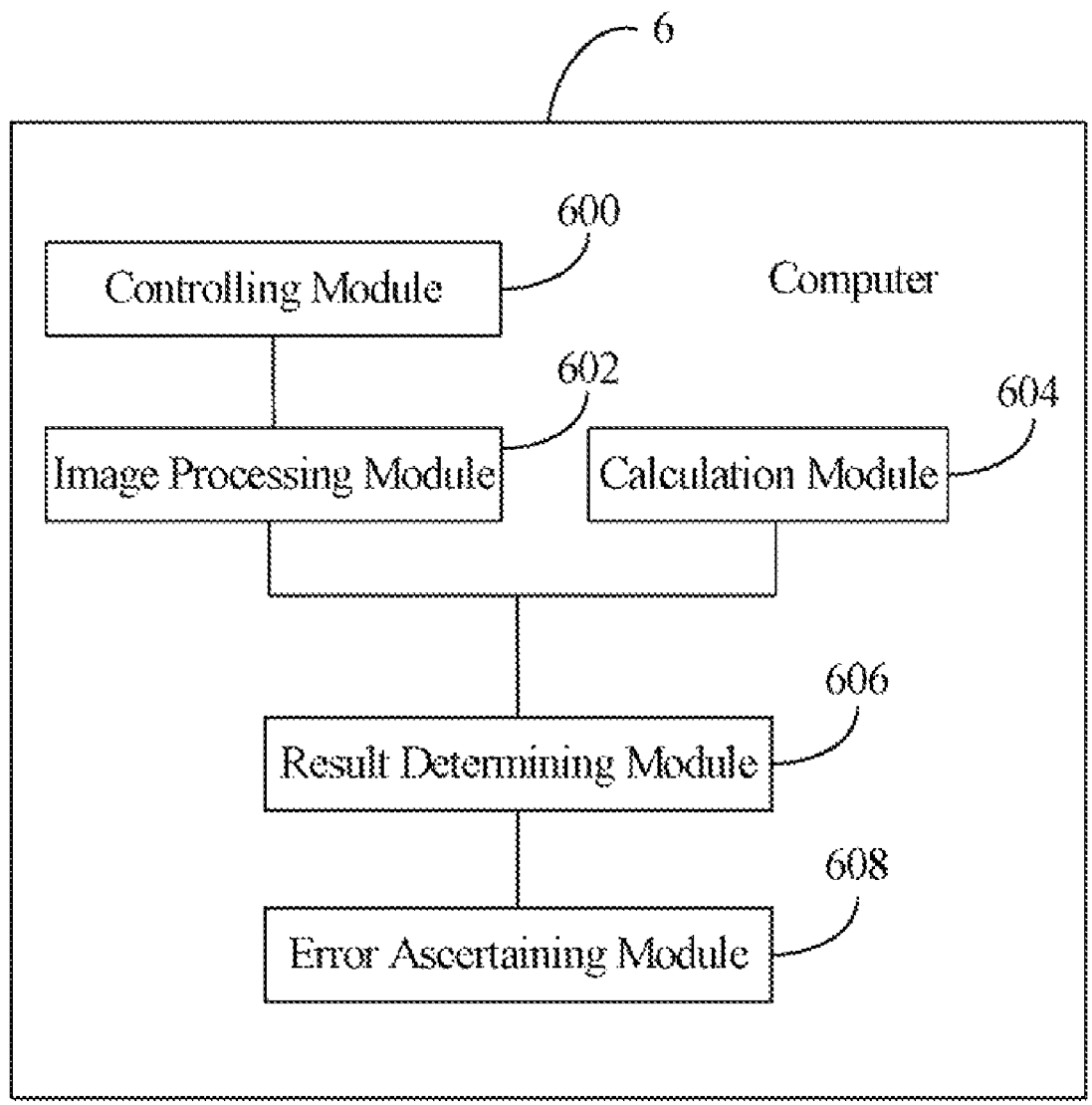
FIG. 3 is a schematic diagram of software function modules of a computer of FIG. 1.

FIG. 3 a schematic diagram of software function modules of the computer 6 in FIG. 1. The computer 6 typically includes: a controlling module 600, an image processing module 602, a calculation module 604, a result determining module 606, and an error ascertaining module 608.

The controlling module 600 is configured for setting the given number of the LEDs 12 in a power-on state or in a power-off state, by controlling the luminance of the given number of the LEDs 12. The controlling module 600 is further configured for controlling the camera module 5 to take the first bulb image of the transparent bulbs 30 on the panel 3 when the given number of the LEDs 12 is in the power-on state and take the second bulb image of the transparent bulbs 30 when the LEDs 12 are in the power-off state. No matter the camera module 5 takes the first bulb image or the second bulb image, the calculation module 604 can obtain the number of pixels of the first bulb image or the second bulb image that is calculated by the camera module 5. In the preferred embodiment, the number of the pixels of the first bulb image is equal to the number of the pixels of the second bulb image.

The image processing module 602 is configured for processing the first bulb image to obtain a first black and white image with an identifying shade, and processing the second bulb image to obtain a second black and white image with an identifying shade. Image processing includes the analysis of an image, using techniques that can identify shades, colors, and relationships that cannot be perceived by the human eye. Image processing is used to deal with images in bitmapped graphics format that have been captured with the camera module 5. The image processing module 602 is further configured for dividing the first bulb image and the second bulb image into several small pictures according to the locations of the transparent bulbs 30 on the panel 3 and the number of the transparent bulbs 30. That is, each of the small pictures contains one transparent bulb image and the number of the small pictures equals the number of the transparent bulbs 30. In the preferred embodiment, an instance of processing or calculating the small pictures of the first bulb image is given as below.

The calculation module 604 is configured for calculating the number of the pixels of each of the small pictures, obtaining a pixel value of each of the pixels in each of the small pictures and calculating an average pixel value of each of the small pictures (depicted as "$M_t$") based on the number of the pixels and the pixel value of each of the pixels in each of the small pictures, and then calculating the first difference $D_1$ and the second difference $D_0$ in accordance with the formulas: $D_1=|M_1-M_t|$, $D_0=|M_0-M_t|$. $M_1$ is the first predetermined value of the standard transparent bulb, and $M_0$ is the second predetermined value of the standard transparent bulb.

The result determining module 606 is configured for determining whether a present state of the given number of the LEDs 12 is in darkness or in lightness by comparing the first difference $D_1$ and the second difference $D_0$. If $D_1 > D_0$, the present state of the given number of the LEDs 12 is in darkness; otherwise, if $D_1 < D_0$, the present state of the given number of the LEDs 12 is in lightness. The result determining module 606 is further configured for obtaining test results by comparing the set state with the present state of the LEDs 12. The error ascertaining module 608 is configured for ascertaining whether each of the LEDs 12 on the motherboard 1 is in an unworkable or workable state according to the test results and for outputting the ascertaining results. In the preferred embodiment, the error ascertaining module 608 can number each of the given number of the LEDs 12 and the transparent bulbs 30 in advance. In an alternative embodiment, a multiplexer is used for ordered selections of the given number of the LEDs 12 and the given number of transparent bulbs 30.

Figure 4:
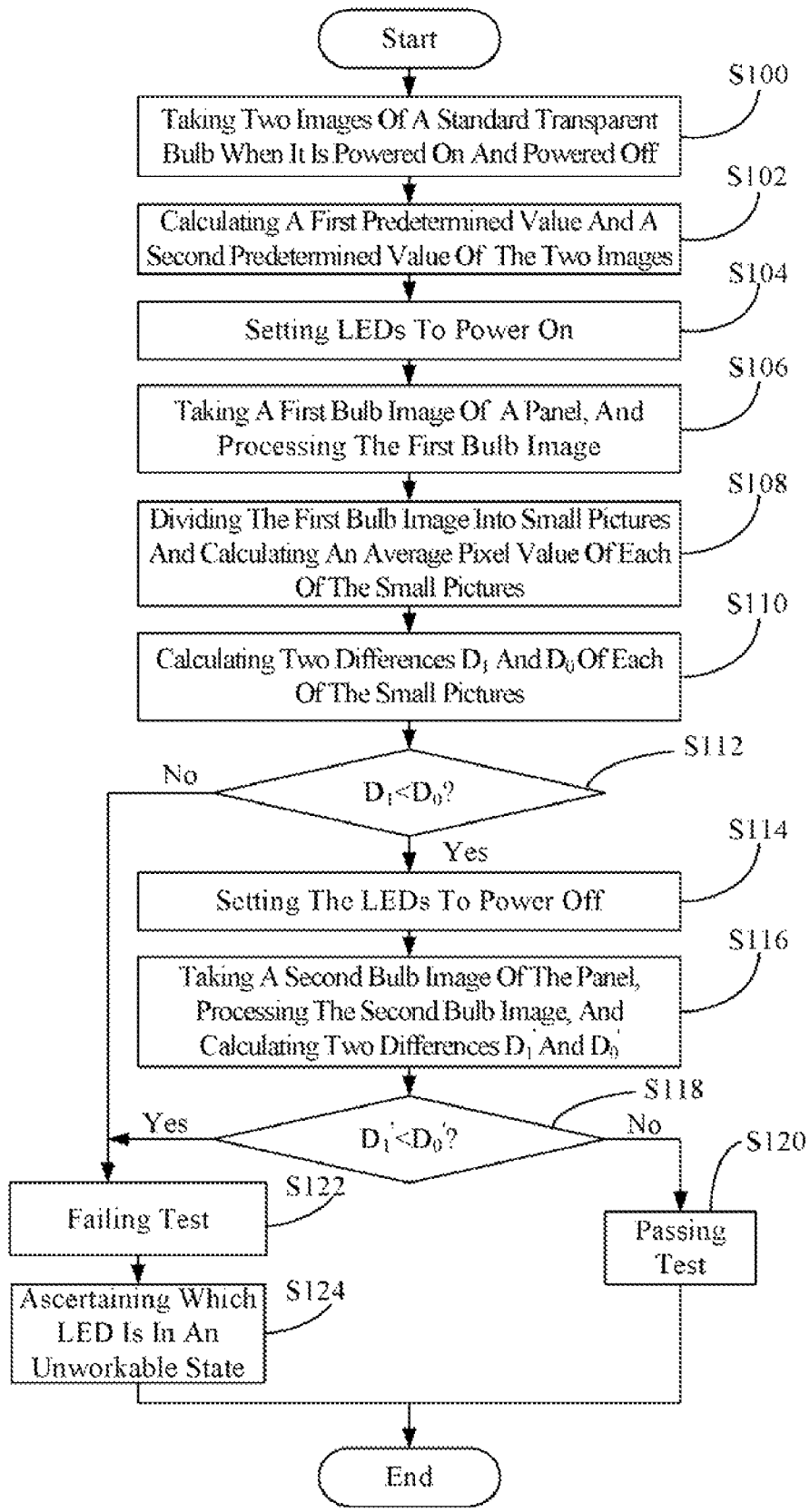
FIG. 4 is a flowchart of a preferred method for testing LEDs on a motherboard in accordance with another embodiment.

FIG. 4 is a flowchart of a preferred method for testing LEDs on a motherboard, in accordance with another embodiment. Before testing the given number of the LEDs 12, an operator positions the insulating plate 2 on the motherboard 1 and connects the given number of the LEDs 12 with the given number of transparent bulbs 30 via the optical fibers 4. In step S100, the controlling module 600 controls the camera module 5 to take the first image of the standard transparent bulb when the standard transparent bulb is powered on and take the second image of the standard transparent bulb when the standard transparent bulb is powered off.

In step S102, the calculation module 604 calculates the first predetermined value $M_1$ and the second predetermined value $M_0$ of the two images of the standard transparent bulb taken from the camera module 5.

In step S104, the controlling module 600 sets the given number of the LEDs 12 in a power-on state by controlling the luminance of each of the LEDs 12.

In step S106, the controlling module 600 controls the camera module 5 to take the first bulb image of the panel 3 which is configured with the given number of transparent bulbs 30 when the LEDs 12 are in the power-on state, the calculating module 604 obtains the number of the pixels in the first bulb image that is calculated by the camera module 5, then the image processing module 602 obtains an identify shade, and obtains a black and white image by processing the first bulb image.

In step S108, the image processing module 602 divides the first bulb image into several small pictures according to the locations of the transparent bulbs 30 on the panel 3 and the number of the transparent bulbs 30, the calculation module 604 calculates the number of the pixels of each of the small pictures, obtaining the pixel value of each of the pixels and calculates an average pixel value $M_t$ (considered as a first average pixel value) of each of the small pictures based on the number of the pixels and the pixel value of each of the pixels in each of the small pictures. In the preferred embodiment, each of the small pictures contains one transparent bulb image and the number of the small pictures equals the number of the transparent bulbs 30.

In step S110, the calculation module 604 calculates the first difference $D_1$ and the second difference $D_0$ in accordance with the formulas: $D_1=|M_1-M_t|$, $D_0=|M_0-M_t|$.

In step S112, the result determining module 606 compares the first difference $D_1$ and the second difference $D_0$ to determine whether the first difference $D_1$ is less than the second difference $D_0$. If $D_1 > D_0$, the present state of the given number of the LEDs 12 is in darkness, the procedure enters directly into step S122 as described below; otherwise, if $D_1 < D_0$, in step S114, the present state of the given number of the LEDs 12 is in lightness, the controlling module 600 controls the luminance of each of the LEDs 12 to set the given number of the LEDs 12 in a power-off state.

In step S116, the controlling module 600 controls the camera module 5 to take a second bulb image of the panel 3, the panel 3 is configured with the given number of transparent bulbs 30 when the LEDs 12 are in the power-off state, the calculating module 604 obtains the number of the pixels of the second bulb image calculated by the camera module 5, the image processing module 602 processes the second bulb image to divide the second bulb image into several small pictures, following which, the calculation module 604 calculates a second average pixel value of each of the small pictures (depicted as "$M_t'$") according to the average pixel value of the second bulb image and calculates a third difference (depicted as "$D_1'$") and a forth difference (depicted as "$D_0'$") in accordance with the formulas: $D_1'=|M_1-M_t'|$, $D_0'=|M_0-M_t'|$. Such method is the same as is from step S106 to S110. In the preferred embodiment, the number of the pixels of the first bulb image is the same as the number of the pixels of the second bulb image.

In step S118, the result determining module 606 compares the third difference D1' and the forth difference D0' to determine whether the third difference D1' is less than the forth difference $D_0'$.

If D1'>D0', in step S120, the present state of the given number of the LEDs 12 is in darkness, according to step S114, the controlling module 600 sets the given number of the LEDs 12 in the power-off state, so the result determining module 606 ascertains the present state of the given number of the LEDs 12 is the same as the set state, namely, the given number of the LEDs 12 pass the test and being in an workable state.

Otherwise, if D1'<D0', in step S122, the present state of the given number of the LEDs 12 is in lightness, according to step S114, the result determining module 606 ascertains the present state of the given number of the LEDs 12 is different from the set state, namely, the given number of the LEDs 12 fails the test and being in an unworkable state.

In step S124, the result determining module 606 reports the test results and the error ascertaining module 608 ascertains which LED on the motherboard 1 is in an unworkable state according to the test results and outputs the ascertaining results.

In the preferred embodiment, the operator can also set the given number of the LEDs 12 to power off at first and then set the given number of the LEDs 12 to power on.

It is to be understood, however, that even though numerous characteristics and advantages of the indicated invention have been set forth in the foregoing description, together with details of the structure and function of the invention, the disclosure is illustrative only and changes may be made in details, especially in matters of shape, size and arrangement of parts within the principles of the invention to the full extent indicated by the broad general meaning of the terms in which the appended claims are expressed.

What is claimed is:

1. A system for testing light-emitting diodes (LEDs) on a motherboard, comprising:

an insulating plate positioned on the motherboard and configured with optical fibers for inducing beams sourced from the LEDs;

a panel receiving the beams transmitted from the LEDs, the panel being connected to the insulating plate with the optical fibers, the panel comprising a corresponding number of transparent bulbs configured for outputting the beams sourced from the LEDs;

a camera module fixed on the panel and configured for taking a first bulb image of the transparent bulbs when the LEDs are powered on and taking a second bulb image of the transparent bulbs when the LEDs are powered off; and a computer connected to the motherboard and the camera module, the computer configured for dividing the first bulb image and the second bulb image created by the camera module into several small pictures, calculating an average pixel value of each of the small pictures, calculating a first difference of each of the small pictures between the corresponding average pixel value and a first predetermined value, calculating a second difference of each of the small pictures between the corresponding average pixel value and a second predetermined value, and obtaining test results by comparing the first difference of each of the small pictures with the second difference of the corresponding small picture and reporting the test results.

2. The system for testing LEDs on a motherboard as described in claim 1, wherein the first predetermined value is an average pixel value of an image of a standard transparent bulb when the standard transparent bulb is powered on, and the second predetermined value is an average pixel value of an image of the standard transparent bulb when the standard transparent bulb is powered off.

3. The system for testing LEDs on a motherboard as described in claim 2, wherein the computer is further configured for:

controlling the camera module to take the first bulb image and the second bulb image, and obtaining the number of pixels of the first bulb image calculated by the camera module;

performing said dividing;

calculating the number of pixels in each of the small pictures based on the number of pixels of the first bulb image, obtaining a pixel value of each of the pixels in each of the small pictures, and performing said calculating;

ascertaining a present state of each of the LEDs by comparing the first difference of each of the small pictures with the second difference of the corresponding small picture, and obtaining test results by comparing the present state of each of the LEDs with the corresponding set state, and the result determining module configured for performing said reporting; and ascertaining whether each of the LEDs is in a workable state or in an unworkable state according to the test results, and outputting the ascertaining results.

4. The system for testing LEDs on a motherboard as described in claim 3, wherein the computer is further configured for setting the LEDs in the power-on state or in the power-off state by controlling the luminance of the LEDs.

5. The system for testing LEDs on a motherboard as described in claim 3, wherein the computer is further configured for processing the first bulb image to obtain a first black and white image with an identifying shade, and processing the second bulb image to obtain a second black and white image with an identifying shade.

6. The system for testing LEDs on a motherboard as described in claim 1, wherein the insulating plate comprises optical fibers within a pipeline for each of the LEDs that is connected to a transparent bulb via the optical fibers.

7. A method for testing light-emitting diodes (LEDs) on a motherboard, the method comprising:

positioning an insulating plate on the motherboard and connecting the LEDs of the motherboard to a panel via optical fibers of the insulating plate, wherein the panel comprises transparent bulbs configured to output beams sourced from the LEDs, the panel fixed with a camera module;

taking a first bulb image of the transparent bulbs on the panel by utilizing the camera module when the LEDs are set in a power-on state and taking a second bulb image of the transparent bulbs when the LEDs are set in a power-off state, and calculating the number of pixels of the first bulb image;

processing the first bulb image and the second bulb image of the transparent bulbs and dividing the first bulb image and the second bulb image into small pictures;

calculating the number of pixels in each of the small pictures based on the number of the pixels of the first bulb image, obtaining a pixel value of each of the pixels in each of the small pictures and calculating an average pixel value of each of the small pictures;

calculating a first difference between the average pixel value of each of the small pictures and a first predetermined value, and calculating a second difference between the average pixel value of the small pictures and a second predetermined value;

ascertaining a present state of each of the LEDs by comparing the first difference of each of the small pictures with the second difference of the corresponding small picture;

obtaining test results by comparing the present state of each of the LEDs with a set state of each of the LEDs; and reporting the test results.

8. The method for testing LEDs on a motherboard as described in claim 7, further comprising a step of:
setting the LEDs in the power-on state or in the power-off state by controlling luminance of the LEDs.

9. The method for testing LEDs on a motherboard as described in claim 7, wherein the first predetermined value is an average pixel value of an image of a standard transparent bulb when the standard transparent bulb is powered on, and the second predetermined value is an average pixel value of an image of the standard transparent bulb when the standard transparent bulb is powered off.

10. The method for testing LEDs on a motherboard as described in claim 7, wherein the step of comparing the first difference of each of the small pictures with the second difference of the corresponding small picture further comprises steps of:
ascertaining the present state of the LEDs being in lightness if the first difference of each of the LEDs is less than the second difference of the corresponding small picture; and
ascertaining the present state of the LEDs being in darkness if the first difference of each of the LEDs is larger than the second difference of the corresponding small picture.

11. The method for testing LEDs on a motherboard as described in claim 7, wherein the step of obtaining test results further comprises steps of:
passing the test if the present state of all of the LEDs are the same as the set state; and
failing the test if the present state of any of the LEDs is different from the set state.

12. The method for testing LEDs on a motherboard as described in claim 11, further comprising steps of:
ascertaining each of the LEDs on the motherboard is in a workable state or in an unworkable state according to the test results; and
outputting the ascertaining results.

13. A method for testing light-emitting diodes (LEDs) on a motherboard, the method comprising:
using a camera module to take a first bulb image of transparent bulbs which are connected to each of the LEDs when the LEDs are set in a power-on state and taking a second bulb image of the transparent bulbs when the LEDs are set in a power-off state;
processing the first bulb image and the second bulb image and dividing the first bulb image and the second bulb image into small pictures;
calculating an average pixel value of each of the small pictures, calculating a first difference of each of the small pictures between the average pixel value and a first predetermined value, and calculating a second difference of each of the small pictures between the average pixel value and a second predetermined value;
ascertaining a present state of each of the LEDs by comparing the first difference of each of the small pictures with the second difference of the corresponding small picture;

obtaining test results by comparing the present state of each of the LEDs with the set state of each of the LEDs; and reporting the test results.

14. The method for testing LEDs on a motherboard as described in claim 13, further comprising steps of:
positioning an insulating plate on the motherboard;
connecting each of the LEDs of the motherboard to a transparent bulb on a panel via optical fibers of the insulating plate, wherein the transparent bulb configured to output beams sourced from the corresponding LED; and
fixing the camera module on the panel.

15. The method for testing LEDs on a motherboard as described in claim 13, wherein the step of calculating an average pixel value of each of the small pictures further comprises steps of:
calculating the number of pixels in each of the small pictures based on the number of pixels of the first bulb image;
obtaining a pixel value of each of the pixels in each of the small pictures; and
calculating an average pixel value of each of the small pictures according to the pixel value of each of the pixels and the number of the pixels in each of the small pictures.

16. The method for testing LEDs on a motherboard as described in claim 13, wherein the step of comparing the first difference of each of the small pictures with the second difference of the corresponding small picture further comprises steps of:
ascertaining the present state of the LEDs being in lightness if the first difference of each of the LEDs is less than the second difference of the corresponding small picture; and
ascertaining the present state of the LEDs being in darkness if the first difference of each of the LEDs is larger than the second difference of the corresponding small picture.

17. The method for testing LEDs on a motherboard as described in claim 13, wherein the step of obtaining test results further comprises steps of:
passing the test if the present state of all of the LEDs are the same as the set state; and
failing the test if the present state of any of the LEDs is different from the set state.

18. The method for testing LEDs on a motherboard as described in claim 13, further comprising steps of:
ascertaining each of the LEDs on the motherboard is in a workable state or in an unworkable state according to the test results; and
outputting the ascertaining results.

19. The method for testing LEDs on a motherboard as described in claim 13, wherein the first predetermined value is an average pixel value of an image of a standard transparent bulb when the standard transparent bulb is powered on, and the second predetermined value is an average pixel value of an image of the standard transparent bulb when the standard transparent bulb is powered off.

* * * * *